(12) United States Patent
Lou et al.

(10) Patent No.: US 11,307,246 B2
(45) Date of Patent: Apr. 19, 2022

(54) PROBING APPARATUS AND METHOD OF OPERATING THE SAME

(71) Applicant: STAR TECHNOLOGIES, INC., Hsinchu (TW)

(72) Inventors: Choon Leong Lou, Hsinchu (TW); Yi Ming Lau, Hsinchu (TW)

(73) Assignee: Star Technologies, Inc., Hsinchu (TW)

( * ) Notice: Subject to any disclaimer, the term of this patent is extended or adjusted under 35 U.S.C. 154(b) by 141 days.

(21) Appl. No.: 16/580,145

(22) Filed: Sep. 24, 2019

(65) Prior Publication Data
US 2021/0088581 A1  Mar. 25, 2021

(51) Int. Cl.
*G01R 31/28* (2006.01)
*G01R 1/04* (2006.01)
*G01R 1/067* (2006.01)
*G01R 1/073* (2006.01)

(52) U.S. Cl.
CPC ....... *G01R 31/2887* (2013.01); *G01R 1/0433* (2013.01); *G01R 1/07342* (2013.01)

(58) Field of Classification Search
CPC .......... G01R 31/28; G01R 31/2887; G01R 31/2891; G01R 31/2893; G01R 31/2851; G01R 31/2865; G01R 31/2889; G01R 1/04; G01R 1/067; G01R 1/06777; G01R 1/073; G01R 1/07342; G01R 1/07392
See application file for complete search history.

(56) References Cited

U.S. PATENT DOCUMENTS

| 7,180,317 B2 | 2/2007 | Hollman |
| 2002/0180961 A1 | 12/2002 | Wack et al. |

(Continued)

FOREIGN PATENT DOCUMENTS

| CN | 101769987 A | 7/2010 |
| CN | 102290363 B | 12/2011 |

(Continued)

OTHER PUBLICATIONS

Office Action dated Jul. 29, 2020 in TW application No. 108137940.
(Continued)

*Primary Examiner* — Neel D Shah
(74) *Attorney, Agent, or Firm* — Muncy, Geissler, Olds & Lowe, P.C.

(57) ABSTRACT

A probing apparatus includes a chuck supporting a DUT, and a platform with an opening above the chuck. The probing apparatus further includes first and second rails positioned at first and second sides of the platform, respectively. The probing apparatus further includes a probing device, the probing device includes a probing module slidably along the first and second rails, and a first motor system configured to automatically align a probe card with the DUT. The probing module includes a third rail with two ends slidably attached to the first and second rails, respectively, a probing stage slidably attached to the third rail, and the probe card attached to the probing stage. The first motor system includes a first motor configured to control movement of the probing stage along the third rail, and a second motor configured to control movement of the probing module along the first and second rails.

19 Claims, 5 Drawing Sheets

(56) References Cited

U.S. PATENT DOCUMENTS

| | | | | |
|---|---|---|---|---|
| 2007/0126440 A1* | 6/2007 | Hobbs | ............... | G01R 31/2893 |
| | | | | 324/754.03 |
| 2007/0268029 A1* | 11/2007 | McClanahan | ...... | G01R 31/2891 |
| | | | | 324/750.09 |
| 2008/0074121 A1* | 3/2008 | Lou | .................... | G01R 31/2891 |
| | | | | 324/555 |

FOREIGN PATENT DOCUMENTS

| CN | 106950485 A | 7/2017 |
|---|---|---|
| JP | 2000-49200 | 2/2000 |
| TW | 200743808 A | 12/2007 |
| TW | 200844460 A | 11/2008 |
| TW | 201925809 A | 7/2019 |

OTHER PUBLICATIONS

Office Action corresponding to Korean application dated Apr. 21, 2021. (pp. 9).

* cited by examiner

PROBING APPARATUS AND METHOD OF OPERATING THE SAME

TECHNICAL FIELD

The present disclosure relates to a probing apparatus, and particularly relates to a probing apparatus for testing a semiconductor device. Further, the present disclosure relates to a method of operating the probing apparatus, and particularly relates to a method of operating the probing apparatus and testing icy the semiconductor device.

DISCUSSION OF THE BACKGROUND

After fabrication, a semiconductor device under test (DUT), such as a wafer that includes dies, is tested by a probing apparatus. A probe card is used to test electrical properties of the DUT in order to select and discard those DUT which does not meet the product specifications. Traditionally, the probe card is designed according to the specification and the position of contact pads of the DUT. A probe card includes a plurality of probes, and the position of each probe is precisely adjusted to meet the specification of the DUT in order to carry out accurate and steady electrical testing.

To reduce the cost, current probe cards are being equipped with increasing numbers of probes to contact multiple contact pads of the DUT, and probing apparatuses are equipped with pluralities of probe cards, so that testing can be performed on several dies at the same time. In such arrangements, it is necessary to align the tips of the probes with the contact pads of the DUT, so that all of the probes contact the contact pads of the DUT simultaneously. Achieving accurate alignment consumes a significant amount of effort and time. However, if the accurate alignment is not achieved, some probes may fail to establish electrical connections with corresponding contact pads. As such, accuracy of the testing may be decreased.

Accordingly, there is a continuous need to precisely control the alignment of the of the probe card without requiring extensive human intervention.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a probing apparatus. The probing apparatus includes a chuck configured to support a device under test (DUT), and a platform with an opening above the chuck. The probing apparatus further includes a first rail positioned at a first side of the platform, and a second rail positioned at a second side opposite to the first side of the platform. The probing apparatus further includes a probing module slidable along the first and second rails, and a first motor system configured to automatically align the probe card with the DUT. The probing module includes a third rail with two ends slidably attached to the first and second rails respectively, a probing stage slidably attached to the third rail, and a probe card attached to the probing stage. The first motor system includes a first motor configured to control movement of the probing stage along the third rail, and a second motor configured to control movement of the probing module along the first and second rails.

In some embodiments, the first motor is electrically connected to the probing stage.

In some embodiments, the second motor is electrically connected to the probing module.

In some embodiments, the second motor is configured to synchronously move the two ends of the third rail along the first and second rails, respectively.

In some embodiments, the probing apparatus further includes a second motor system configured to automatically align the probe card with the DUT. The second motor system includes a first tuning motor configured to control movement of the probing stage along a first direction parallel to the third rail, and a second tuning motor configured to control movement of the probing stage along a second direction parallel to the first and second rails. The second motor system includes a third tuning motor configured to control movement of the probing stage along a third direction toward or away from the chuck, and a fourth tuning motor configured to control orientation of the probe card relative to the probing stage.

In some embodiments, the fourth tuning motor is configured to centrally rotate the probing card relative to the probing stage to align the probe card with the DUT.

In some embodiments, the probing stage further includes a carrier configured to hold the probe card.

In some embodiments, the opening has a rectangular shape.

In some embodiments, the DUT is a semiconductor device or a wafer.

In some embodiments, the probe card includes a first surface, a second surface opposite to the first surface, a peripheral wall substantially orthogonal to and disposed between the first surface and the second surface, and a plurality of probes protruding from the peripheral wall and toward the DUT. The first surface is attached to the probing stage.

In some embodiments, the probe card is attached to a vertical sidewall of the probing stage.

In some embodiments, the first motor includes two actuating motors configured to control movement of the two ends of the third rail, respectively.

Another aspect of the present disclosure provides a method of operating a probing apparatus. The probing apparatus includes a chuck configured to support a DUT, a platform with an opening above the chuck, a first rail at a first side of the platform, a second rail at a second side of the platform opposite to the first side, a probing module including a third rail, and a probing stage on the third rail. The method includes attaching a probe card to the probing stage, and aligning the probe card with the DUT. The alignment includes operating a first motor system to actuate the probing module to automatically slide along the first rail and the second rail, and actuate the probing stage of the probing module to automatically slide along the third rail.

In some embodiments, the probing module automatically slides along the first rail and the second rail, and the probing stage automatically slides along the third rail.

In some embodiments, the first motor system includes a first motor electrically connected to the probing stage and a second motor electrically connected to the probing module, the probing stage is actuatable by a first motor, and the probing module is actuatable by a second motor.

In some embodiments, the alignment includes synchronizing a movement of the probing module along the first rail with a movement of the probing module along the second rail.

In some embodiments, the alignment includes operating a second motor system to: actuate the probing stage to automatically move along a direction parallel to at least one of the first, second and third rails; or actuate the probe card to automatically rotate relative to the probing stage.

In some embodiments, the operation of the first motor system occurs prior to the operation of the second motor system.

In some embodiments, the probe card is aligned with the DUT after the operation of the first motor system and the operation of the second motor system.

In some embodiments, the method further includes moving the chuck toward the probe card after the operation of the first motor system and the operation of the second motor system.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
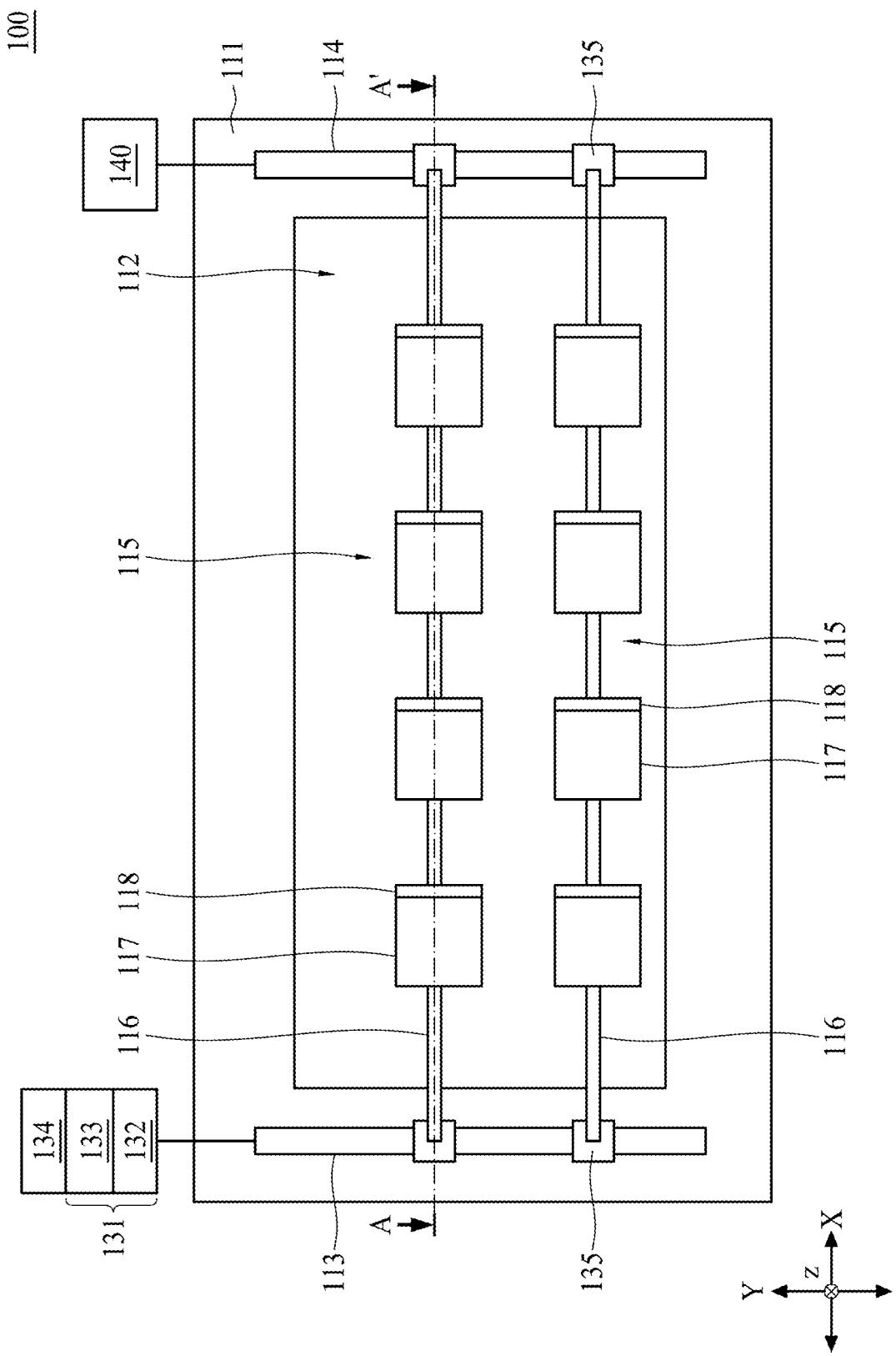
FIG. 1 is a schematic top view of a probing apparatus in accordance with some embodiments of the present disclosure.
Figure 2:
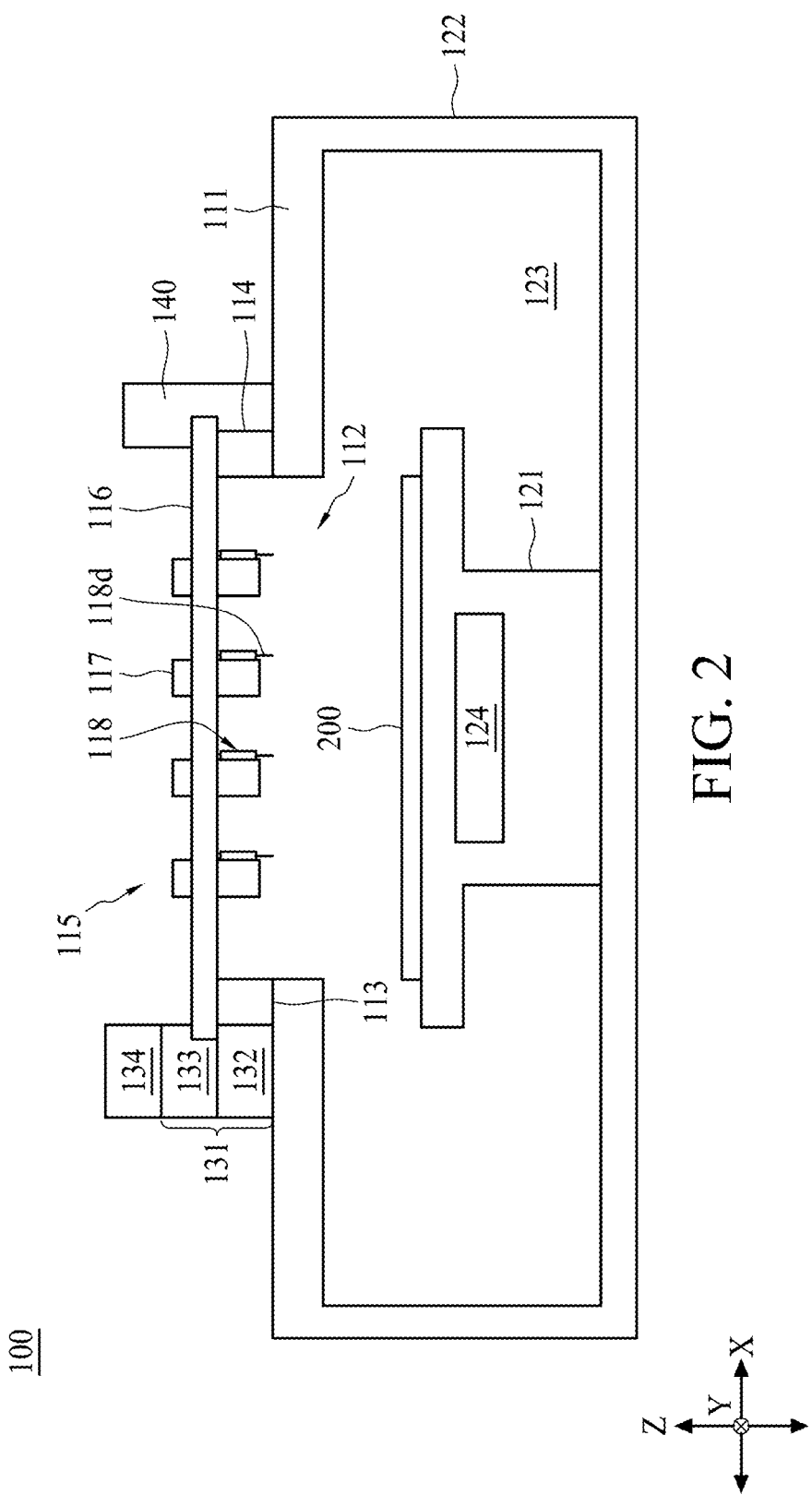
FIG. 2 is a schematic cross-sectional view of a probing apparatus in accordance with some embodiments of the present disclosure.

The present disclosure provides a probing apparatus which is capable of automatically controlling and aligning the probe card with a DUT, such as a semiconductor device or a wafer. FIGS. 1 and 2 show a probing apparatus 100 according to aspects of the present disclosure in some embodiments. FIG. 1 is a schematic top view illustrating a probing apparatus 100 according to aspects of the present disclosure in some embodiments. FIG. 2 is a schematic cross-sectional view taken along a line A-A' in FIG. 1. The probing apparatus 100 includes a chuck 121 positioned in a housing 122 and configured to support a DUT 200, and a platform 111 with an opening 112 above the chuck 121. In some embodiments, the housing 122 is configured to define a testing chamber 123. The chuck 121 and the DUT 200 are arranged in the testing chamber 123. In some embodiments, the opening 112 has a rectangular, circular or polygonal shape.

The probing apparatus 100 includes a first rail 113 positioned at a first side of the platform 111 and a second rail 114 positioned at a second side opposite to the first side of the platform 111. In some embodiments, the first rail 113 and the second rail 114 extend in the same direction. In some embodiments, the first rail 113 and the second rail 114 extend in a direction Y.

The probing apparatus 100 includes a probing module 115 slidable along the first and second rails 113, 114. The probing module 115 includes a third rail 116 with two ends slidably attached to the first and second rails 113, 114, respectively. A probing stage 117 is slidably attached to the third rail 116, and a probe card 118 is attached to the probing stage 117. In some embodiments, the probing module 115 is disposed on the first and second rails 113, 114. In some embodiments, the third rail 116 is substantially perpendicular to the first rail 113 and the second rail 114. In some embodiments, the third rail 116 extends in a direction X. In some embodiments, the probing module 115 includes a plurality of the probing stages 117 slidably attached to the third rail 116. For example as shown in FIG. 1, the probing module 115 includes four probing stages 117 slidably attached to the third rail 116. In some embodiments, all of the probing stages 117 have a same size and shape, but the disclosure is not limited thereto. In some embodiments, the probing stages 117 are spaced apart from each other.

Figure 3:
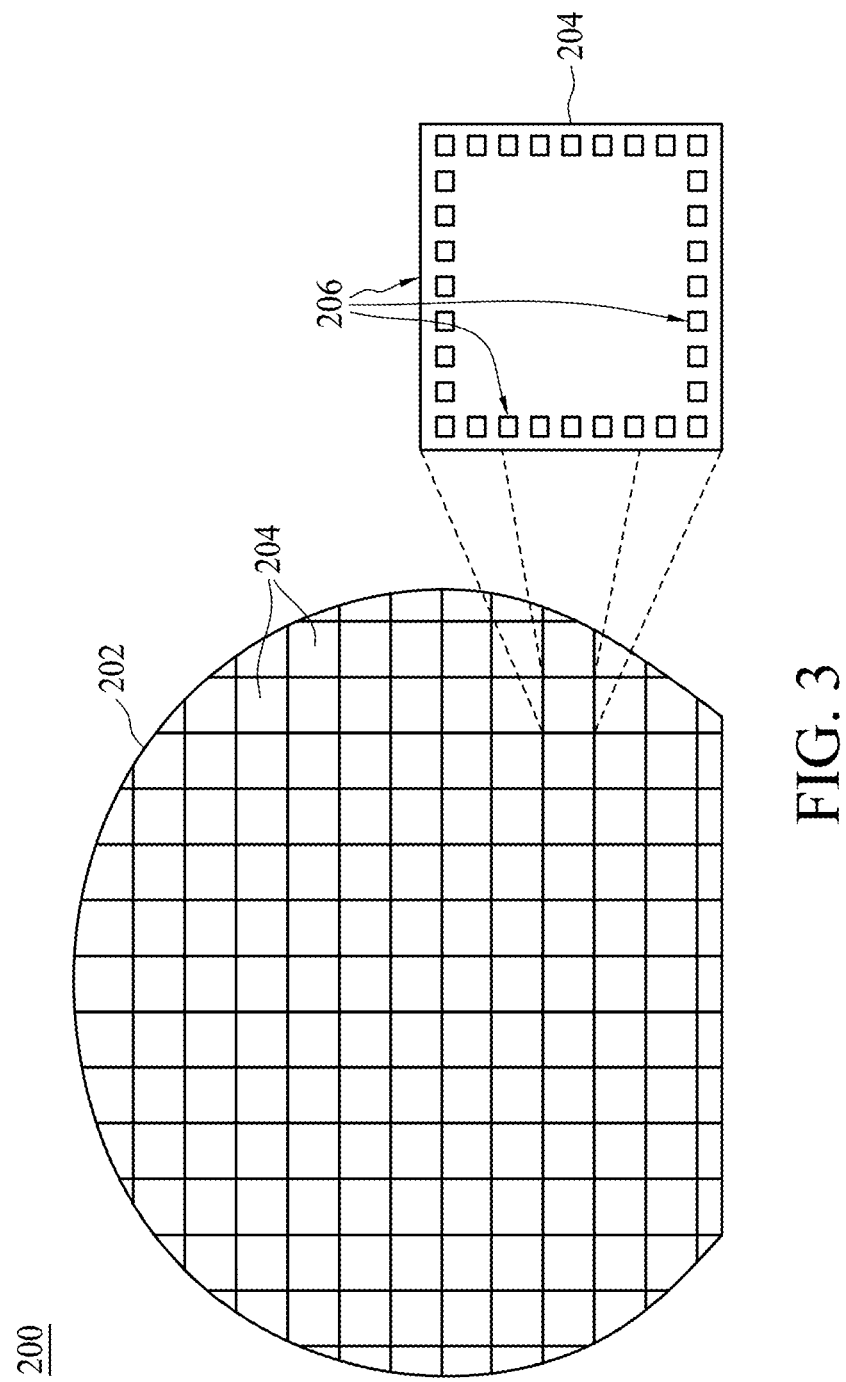
FIG. 3 is a schematic top view of a wafer and a plurality of dies therein.

The probing apparatus 100 includes a first motor system 131 configured to automatically align the probe card 118 with the DUT 200. In some embodiments, the DUT 200 is a wafer 202 as illustrated in FIG. 3, and the first motor system 131 is configured to automatically align a probe 118d protruded from the probe card 118 with a contact pad 206 of a die 204 on the wafer 202. The first motor system 131 includes a first motor 132 configured to control movement of the probing stage 117 along the third rail 116, and a second motor 133 configured to control movement of the probing module 115 along the first and second rails 113, 114.

In some embodiments, the first motor 132 is electrically connected to the probing stage 117. In some embodiments, the second motor 133 is electrically connected to the probing module 115. In some embodiments, the second motor 133 is configured to synchronously move the two ends of the third rail 116 along the first and second rails 113, 114, respectively.

In some embodiments, the first motor system 131 is configured to coarsely align the probe card 118 with the DUT 200. In some embodiments, the probing apparatus 100 further includes a second motor system 134 configured to automatically control the fine alignment of the probe card 118 with the DUT 200. In some embodiments, the second motor system 134 is configured to finely move the probing stage 117 individually or move the probe card 118 individually, such that the probe card 118 can align with the DUT 200.

In some embodiments, the second motor system 134 includes a first tuning motor, a second tuning motor, a third tuning motor, and a fourth tuning motor. In some embodiments, the first tuning motor is configured to control movement of the probing stage 117 or the probe card 118 along a first direction X parallel to the third rail 116. In some embodiments, the first tuning motor can control the fine movement of the probing stage 117 or the probe card 118 along the first direction X to align the probe card 118 with the DUT 200.

In some embodiments, the second tuning motor is configured to control movement of the probing stage 117 or the probe card 118 along a second direction Y parallel to the first and second rails 113, 114. In some embodiments, the second tuning motor can control the fine movement of the probing stage 117 or the probe card 118 along the second direction Y to align the probe card 118 with the DUT 200.

In some embodiments, the third tuning motor is configured to control movement of the probing stage 117 or the probe card 118 along a third direction Z toward or away from the chuck 121. In some embodiments, the third tuning motor can control the fine movement of the probing stage 117 or the probe card 118 along the third direction Z to align the probe card 118 with the DUT 200.

In some embodiments, the fourth tuning motor is configured to control orientation of the probe card 118 relative to the probing stage 117. In some embodiments, the fourth tuning motor is configured to centrally rotate the probe card 118 relative to the probing stage 117 to align the probe card 118 with the DUT 200.

In some embodiments, the probing apparatus 100 further includes a temperature-controlling device 124 configured to adjust temperature of the DUT 200 and the probes 118d to a predetermined temperature. In some embodiments, the temperature-controlling device 124 is integrated with the chuck 121.

Figure 4:
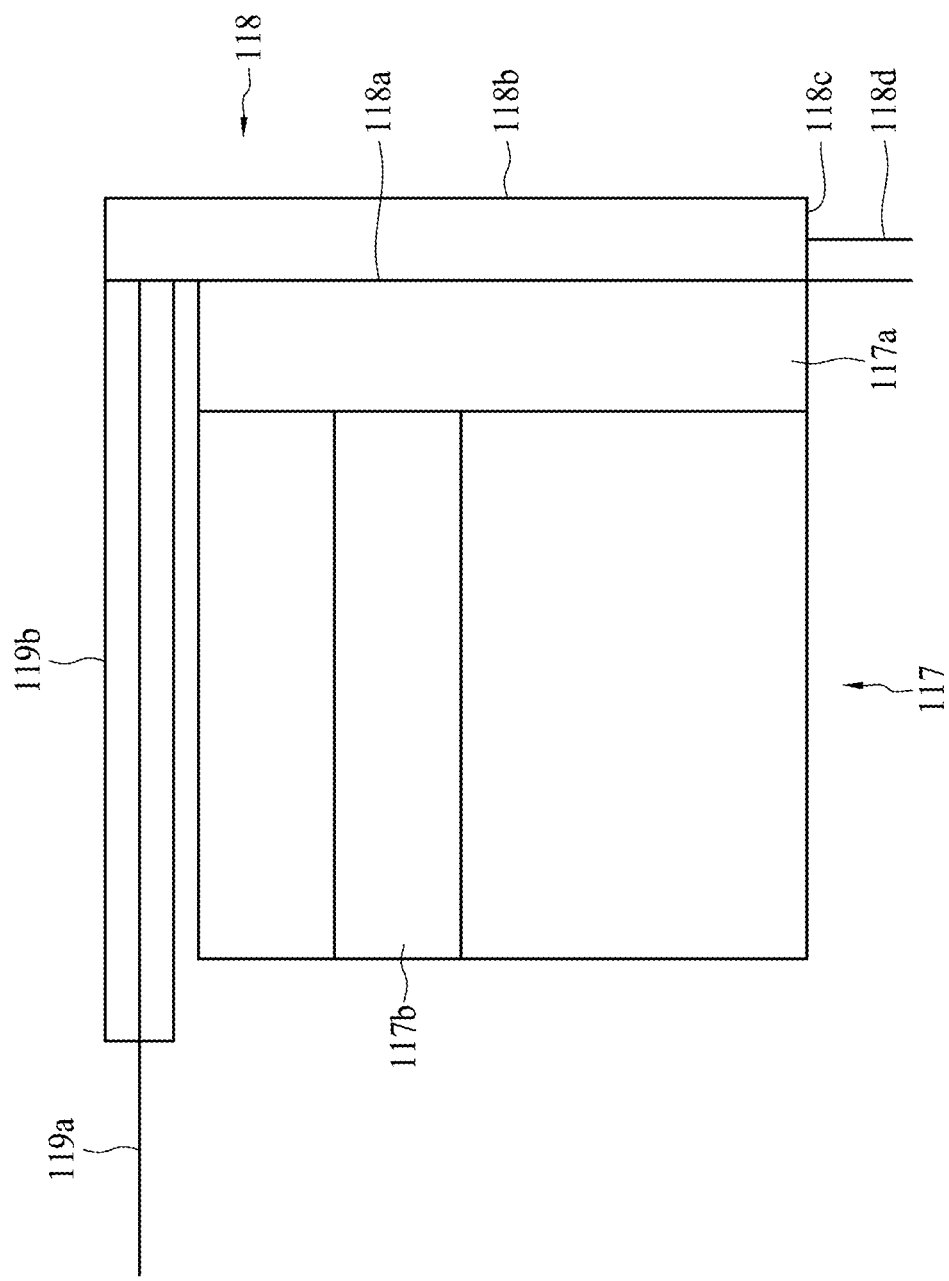
FIG. 4 is a schematic cross-sectional view of a probing stage and a probe card in accordance with some embodiments of the present disclosure.
Figure 5:
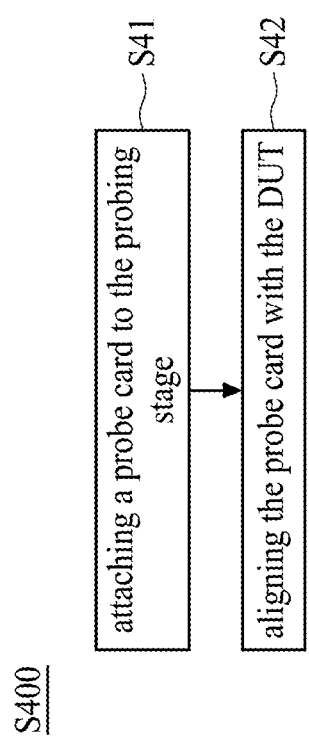
FIG. 5 is a flowchart representing a method of operating a probing apparatus according to aspects of the present disclosure in one or more embodiments.

FIG. 4 is a schematic cross-sectional view of a probing stage 117 and a probe card 118 in accordance with some embodiments of the present disclosure. In some embodiments, as shown in FIG. 4, the probing stage 117 further includes a carrier 117a configured to hold the probe card 118. In some embodiments, the probe card 118 is attached to a vertical sidewall of the probing stage 117. In some embodiments, the probe card 118 attached to the probing stage 117 may be seen from the top view. In some embodiments, the probe card 118 attached to the probing stage 117 is covered by the carrier 117a from the top view.

In some embodiments, the probing apparatus 100 further includes a test module 140 electrically connected to the probe card 118. The test module 140 is configured to process signals detected by the probe card 118 and adjust the position of the DUT 200. In some embodiments, a cable 119a is electrically connected between the test module 140 and the probe card 118. The cable 119a is configured to transmit the signal from the probe card 118 to the DUT 200. In some embodiments, the cable 119a is disposed in a cable housing 119b. In some embodiments, the cable 119a is disposed at the top side of the probe card 118.

In some embodiments, the probe card 118 includes a first surface 118a, a second surface 118b and a peripheral wall 118c. The second surface 118b is opposite to the first surface 118a, and the peripheral wall 118c is substantially orthogonal to and disposed between the first surface 118a and the second surface 118b. A plurality of probes 118d protrude from the peripheral wall 118c and toward the DUT 200. In some embodiments, arrangement of the probes 118d matches the settings of the probe card 118 and the design of the DUT 200. In some embodiments, the first surface 118a of the probe card 118 is attached to the vertical sidewall of the probing stage 117.

Referring back to FIGS. 1 and 2, in some embodiments, the first motor 132 includes one actuating motor configured to control movement of the probing stages 117 attached to the third rail 116. In some embodiments, the second motor 133 includes two actuating motors 135 configured at the two ends of the third rail 116 respectively to control movement of the two ends of the third rail 116, respectively.

In some embodiments, a plurality of probing modules 115 are slidable along the first and second rails 113, 114, such that the probing apparatus 100 may automatically control and move each of the probing modules 115 simultaneously or separately. Each of the probing modules 115 includes probing stages 117 slidably attached to the third rail 116.

In some embodiments, there is a distance D between adjacent probing stages 117. The distance D can be determined based on various factors, including, for example, number of probing stages 117, moving speed of each of the probing stages 117, size of each of the probing stages 117, the position of the DUT 200 or the contact pad 206 on the DUT 200, design rules for the DUT 200, and other factors, as one skilled in the art will understand. In some embodiments, the distances D between adjacent pairs of probing stages 117 may be same or different depending on requirements.

In the present disclosure, a method of operating a probing apparatus is disclosed. In some embodiments, a DUT such as a semiconductor device or a wafer is tested by the method. The method includes a number of operations and the description and illustrations are not deemed as a limitation of the sequence of the operations.

FIG. 6 is a flowchart depicting an embodiment of the method 400 of operating the probing device. The method includes operations 41 and 42. In some embodiments, the operations 41 and 42 can be implemented by the probing apparatus 100 described above or illustrated in FIG. 1.

The method begins with operation 41, in which the probing apparatus 100 is provided, and a probe card 118 is attached to a probing stage 117. The probing apparatus 100 includes a chuck 121 configured to support a DUT 200, and a platform 111 with an opening 112 above the chuck 121. The probing apparatus 100 further includes a first rail 113 at a first side of the platform 111, a second rail 114 at a second side of the platform 111 opposite to the first side, a probing module 115 including a third rail 116, and the probing stage 117 on the third rail 116. The probing module 115 is slidable along the first and second rails 113, 114. In some embodiments, the DUT 200 is a semiconductor device or a wafer.

In operation 42, the probe card 118 is aligned with the DUT 200. The alignment includes operating a first motor system 131 to actuate the probing module 115 to automatically slide along the first rail 113 and the second rail 114, and actuate the probing stage 117 of the probing module 115 to automatically slide along the third rail 116. In some embodiments, the probing module 115 automatically slides along the first rail 113 and the second rail 114, and then each probing stage 117 automatically slides along the third rail 116.

In some embodiments, the DUT 200 is a wafer 202 as illustrated in FIG. 3, wherein the wafer 202 includes dies 204, and each die 204 includes contact pads 206 disposed thereon. In some embodiments, the alignment further includes aligning a probe 118d protruding from the probe card 118 with the contact pad 206 on the DUT 200. In some embodiments, a result of the method is that the probe 118d can automatically and accurately align with the DUT 200 or a contact pad 206 of the DUT 200 by operation of the first motor system 131.

In some embodiments, the first motor system 131 includes a first motor 132 electrically connected to the probing stage 117 and a second motor 133 electrically connected to the probing module 115, the probing stage 117 is actuatable by a first motor 132, and the probing module 115 is actuatable by a second motor 133. In some embodiments, the sliding of the probing module 115 occurs prior to the sliding of the probing stage 117.

In some embodiments, the alignment includes synchronizing a movement of the probing module 115 along the first rail 113 with a movement of the probing module 115 along the second rail 114. As a result, two ends of the third rail 116 are actuated and moved in synchronized manner.

In some embodiments, an operation of a second motor system 134 occurs after the operation of the first motor system 131.

In some embodiments, the alignment includes operating the second motor system 134 to actuate the probing stage 117 to automatically move along the first direction X, the second direction Y or the third direction Z; or actuate the probe card 118 to automatically rotate relative to the probing stage 117.

In some embodiments, the alignment includes operating the first tuning motor of the second motor system 134 to control movement of the probing stage 117 or the probe card 118 along the first direction X to align the probe card 118 with the DUT 200.

In some embodiments, the alignment includes operating the second tuning motor of the second motor system 134 to control movement of the probing stage 117 or the probe card 118 along the second direction Y to align the probe card 118 with the DUT 200.

In some embodiments, the alignment includes operating the third tuning motor of the second motor system 134 to control movement of the probing stage 117 or the probe card 118 along the third direction Z to align the probe card 118 with the DUT 200.

In some embodiments, the alignment includes operating the fourth tuning motor of the second motor system 134 to centrally rotate the probe card 118 relative to the probing stage 117 to align the probe card 118 with the DUT 200.

In some embodiments, the method further includes adjusting a temperature of the DUT 200 and the probe 118d to a predetermined temperature. In some embodiments, the temperature is adjusted through a temperature control element 124.

In some embodiments, the probe card 118 is aligned with the DUT 200 after the operation of the first motor system 131 and the operation of the second motor system 134. In some embodiments, after the operation of the first motor system 131, the probe card 118 is coarsely aligned with the DUT 200. In some embodiments, after the coarse alignment, the temperatures of the probe 118d and the DUT 200 are adjusted by the temperature control device 124 to the predetermined temperature.

In some embodiments, a temperature of the chuck 121 is adjusted by the temperature control element 124. In some embodiments, the temperature control element 124 is a heater. In some embodiments, the chuck 121 is heated by the temperature control element 124. The temperature of the chuck 121 is increased. Since the DUT 200 directly contacts the chuck 121, the temperature of the DUT 200 is also increased. In other words, the DUT 200 is heated by the chuck 121.

In some embodiments, after the coarse alignment and the temperature adjustment of the chuck 121 by the temperature control element 124, the chuck 121 would move towards the probe card 118 to adjust a temperature of the probe 118d or at least tip portion of the probe 118d. In some embodiments, the probe 118d or the tip portion of the probe 118d is warmed up by the DUT 200 or the chuck 121. Since the DUT 200 and the chuck 121 are proximal to the probe 118d after the movement of the chuck 121, the heat of the DUT 200 or the chuck 121 is transmitted to the probe 118d to increase the temperature of the probe 118d or the temperature of the tip portion of the probe 118d. In some embodiments, the probe 118d or the tip portion of the probe 118d is adjusted to a predetermined temperature by the heat from the DUT 200 or the chuck 121 after a predetermined duration. The DUT 200 and the chuck 121 keep proximal to the probe 118d for the predetermined duration until the probe 118d or the tip portion of the probe 118d is adjusted the predetermined temperature. In some embodiments, a distance between the DUT 200 and the probe 118d or the tip portion of the probe 118d is substantially greater than 0 but less than 10 mm.

The temperature change of the probe 118d or the tip portion of the probe 118d may change the volume of the probe 118d. As a result, the probe 118d may become misaligned with the DUT 200 after the temperature adjustment of the probe 118d. Therefore, a fine tuning of positions of the probe 118d relative to the DUT 200 is necessary. In some embodiments, after the coarse alignment, the probe card 118 is further moved by operation of the second motor system 134 to finely align with the DUT 200 by operation of the second motor system 134. In some embodiments, the operation of the second motor system 134 includes operating the first tuning motor to move the probing stage 117 or the probe card 118 along the first direction X, operating the second tuning motor to move the probing stage 117 or the probe card 118 along the second direction Y, operating the third tuning motor to move the probing stage 117 or the probe card 118 along the third direction Z, or operating the fourth tuning motor to centrally rotate the probe card 118 relative to the probing stage 117. In some embodiments, the probe card 118 is aligned with the DUT 200 after the operation of the second motor system 134.

In some embodiments, the method further includes moving the chuck 121 toward the probe card 118 for probing the DUT 200 by the probe 118d after the operation of the first motor system 131 and the operation of the second motor system 134.

Accordingly, the present disclosure therefore provides a probing apparatus and a method of operating a probing apparatus. The probing apparatus includes a chuck configured to support a device under test (DUT), and a platform with an opening above the chuck. The probing apparatus further includes a first rail positioned at a first side of the platform, and second rail positioned at a second side opposite to the first side of the platform. A probing device is also provided, and includes a probing module slidable along the first and second rails, and a first motor system configured to automatically align a probe card with the DUT. The probing module includes a third rail with two ends slidably attached to the first and second rails, respectively, a probing stage slidably attached to the third rail, and the probe card attached to the probing stage. The first motor system includes a first motor configured to control movement of the probing stage along the third rail, and a second motor configured to control movement of the probing module along the first and second rails. Consequently, the probing stage may be automatically aligned with the DUT by operation of the probing apparatus, which may effectively align a plurality of probe cards to the DUT.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A probing apparatus for probing multiple integrated circuit devices, comprising:
    a chuck configured to support a device under test (DUT);
    a platform with an opening above the chuck;
    a first rail positioned at a first side of the platform;
    a second rail positioned at a second side opposite to the first side of the platform;
    a probing module slidable along the first and second rails;
        wherein the probing module includes a third rail with two ends slidably attached to the first and second rails, respectively, a probing stage slidably attached to the third rail, and a probe card attached to the probing stage;
    a first motor system configured to automatically align the probe card with the DUT, and including a first motor configured to control movement of the probing stage along the third rail, and a second motor configured to control movement of the probing module along the first and second rails;
    a temperature-controlling device configured to adjust a temperature of a probe of the probe card to a predetermined temperature; and
    a second motor system configured to automatically align the probe card with the DUT after the temperature-controlling device adjusts the temperature of the probe of the probe card to the predetermined temperature.

2. The probing apparatus of claim 1, wherein the first motor is electrically connected to the probing stage.

3. The probing apparatus of claim 1, wherein the second motor is electrically connected to the probing module.

4. The probing apparatus of claim 1, wherein the second motor is configured to synchronously move the two ends of the third rail along the first and second rails, respectively.

5. The probing apparatus of claim 1, wherein the second motor system includes a first tuning motor configured to control movement of the probing stage along a first direction parallel to the third rail, a second tuning motor configured to control movement of the probing stage along a second direction parallel to the first and second rails, a third tuning motor configured to control movement of the probing stage along a third direction toward or away from the chuck, and a fourth tuning motor configured to control orientation of the probe card relative to the probing stage.

6. The probing apparatus of claim 5, wherein the fourth tuning motor is configured to centrally rotate the probing stage relative to the probing stage to align the probe card with the DUT.

7. The probing apparatus of claim 1, wherein the probing stage further comprises a carrier configured to hold the probe card.

8. The probing apparatus of claim 1, wherein the opening has a rectangular shape.

9. The probing apparatus of claim 1, wherein the DUT is a semiconductor device or a wafer.

10. The probing apparatus of claim 1, wherein the probe card includes a first surface, a second surface opposite to the first surface, a peripheral wall substantially orthogonal to and disposed between the first surface and the second surface, and a plurality of probes protruding from the peripheral wall and toward the DUT, wherein the first surface is attached to the probing stage.

11. The probing apparatus of claim 1, wherein the probe card is attached to a vertical sidewall of the probing stage.

12. The probing apparatus of claim 1, wherein the first motor includes two actuating motors configured to control movement of the two ends of the third rail, respectively.

13. A method of operating a probing apparatus, the probing apparatus comprising a chuck configured to support a DUT, a platform with an opening above the chuck, a first rail at a first side of the platform, a second rail at a second side of the platform opposite to the first side, a probing module including a third rail, a temperature-controlling device and a probing stage on the third rail, the method comprising:
    attaching a probe card to the probing stage; and
    aligning the probe card with the DUT;
    wherein the alignment includes:
        operating a first motor system to actuate the probing module to automatically slide along the first rail and the second rail, and actuate the probing stage of the probing module to automatically slide along the third rail; and
        operating a second motor system, after the temperature-controlling device adjusts a temperature of a probe of the probe card, to actuate the probing stage to automatically move along a direction parallel to at least one of the first, second and third rails, or to actuate the probe card to automatically rotate relative to the probing stage.

14. The method of claim 13, wherein the probing module automatically slides along the first rail and the second rail, and the probing stage automatically slides along the third rail.

15. The method of claim 13, wherein the first motor system includes a first motor electrically connected to the probing stage and a second motor electrically connected to the probing module, the probing stage is actuatable by a first motor, and the probing module is actuatable by a second motor.

16. The method of claim 13, wherein the alignment includes synchronizing a movement of the probing module along the first rail with a movement of the probing module along the second rail.

17. The method of claim 13, wherein the operation of the first motor system occurs prior to the operation of the second motor system.

18. The method of claim 13, wherein the probe card is aligned with the DUT after the operation of the first motor system and the operation of the second motor system.

19. The method of claim 13, further comprising moving the chuck toward the probe card after the operation of the first motor system and the operation of the second motor system.

* * * * *